（12）United States Patent
Yanagi

(10) Patent No.: US 11,933,836 B2
(45) Date of Patent: Mar. 19, 2024

(54) METHOD OF MEASURING A DEVICE PARAMETER

(71) Applicant: Rohm Co., Ltd., Kyoto (JP)

(72) Inventor: Tatsuya Yanagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 191 days.

(21) Appl. No.: 17/433,660

(22) PCT Filed: Mar. 27, 2020

(86) PCT No.: PCT/JP2020/014245
§ 371 (c)(1),
(2) Date: Aug. 25, 2021

(87) PCT Pub. No.: WO2020/209110
PCT Pub. Date: Oct. 15, 2020

(65) Prior Publication Data
US 2022/0146566 A1    May 12, 2022

(30) Foreign Application Priority Data

Apr. 8, 2019 (JP) .................................. 2019073403
Sep. 19, 2019 (JP) .................................. 2019170180

(51) Int. Cl.
*G01R 31/26* (2020.01)
*G01R 31/12* (2020.01)

(52) U.S. Cl.
CPC ......... *G01R 31/2623* (2013.01); *G01R 31/12* (2013.01)

(58) Field of Classification Search
None
See application file for complete search history.

(56) References Cited

U.S. PATENT DOCUMENTS 10,901,024 B2 *  1/2021  Yanagi ................. G06F 30/367
10,908,204 B2 *  2/2021  Yanagi .............. G01R 31/2603
(Continued)

FOREIGN PATENT DOCUMENTS

CN      103207362      7/2013
EP      2615467        7/2013
(Continued)

OTHER PUBLICATIONS

English Translation of JP2017181178A (Year: 2017).*
(Continued)

*Primary Examiner* — Jermele M Hollington
(74) *Attorney, Agent, or Firm* — Fish & Richardson P.C.

(57) ABSTRACT

For example, a method of measuring a device parameter includes: a step of repeatedly measuring the gate-source voltage (or gate-emitter voltage) of a switching element in its switching transient state while switching the external gate resistance for the switching element among m resistance values (where m is an integer of three or more); and a step of, while representing the internal gate resistance and the plateau voltage of the switching element by Rgin and Vp respectively and using the m resistance values of the external gate resistance and corresponding m voltage values of the gate-source voltage (or gate-emitter voltage) as Rg(k) and Vgs(k) respectively (where k=1, 2 ... m), performing the fitting of the equation Vgs(k)=Rg(k)/(Rg(k)+Rgin)×Vp, thereby to derive the internal gate resistance Rgin or the plateau voltage Vp of the switching element.

6 Claims, 12 Drawing Sheets

(56) References Cited

U.S. PATENT DOCUMENTS

| | | |
|---|---|---|
| 2007/0040571 A1 | 2/2007 | Dolian |
| 2013/0177041 A1 | 7/2013 | Sundaramoorthy et al. |
| 2017/0285095 A1 | 10/2017 | Yanagi et al. |
| 2018/0188312 A1* | 7/2018 | Yanagi ............... G01R 31/2603 |
| 2021/0063469 A1 | 3/2021 | Nakamura et al. |
| 2021/0132136 A1* | 5/2021 | Yanagi ............... G01R 31/2603 |

FOREIGN PATENT DOCUMENTS

| | | | | |
|---|---|---|---|---|
| JP | H07176740 | | 7/1995 | |
| JP | 2000058613 | | 2/2000 | |
| JP | 2010211387 | | 9/2010 | |
| JP | 2013142704 | | 7/2013 | |
| JP | 2015161627 | | 9/2015 | |
| JP | 2017181178 | | 10/2017 | |
| JP | 2017181178 A * | | 10/2017 | ......... G01R 31/2601 |
| JP | 6842837 B2 * | | 3/2021 | ......... H01L 29/7802 |
| JP | 6936341 B2 * | | 9/2021 | ......... G01R 31/2621 |
| WO | WO 2019/146460 | | 8/2019 | |

OTHER PUBLICATIONS

International Search Report in International Appln. No. PCT/JP2020/014245, dated Jun. 30, 2020, 6 pages (with English Translation).

* cited by examiner

METHOD OF MEASURING A DEVICE PARAMETER

TECHNICAL FIELD

The present invention relates to a method of measuring a device parameter.

BACKGROUND ART

When creating a device model of a switching element (e.g., a MOSFET [metal-oxide-semiconductor field-effect transistor]) that is used in a computer simulation such as SPICE (simulation program with integrated circuit emphasis), it is essential to measure various device parameters.

An example of known technology related to what is mentioned above is found, for example, in Patent Document 1 identified below.

CITATION LIST

Patent Literature

Patent Document 1: Japanese unexamined patent application publication No. 2017-181178

SUMMARY OF INVENTION

Technical Problem

For a switching element based on a wide-band-gap semiconductor (such as SiC and GaN) (such a switching element will hereinafter be referred to as a WBG device), it is common to use an external gate resistance lower than that used for a switching element based on silicon (such a switching element will hereinafter be referred to as a Si device). For example, typically used for a Si device is an external gate resistances of 50 to 100Ω when turned on and several hundred ohms to 1 kΩ when turned off. By contrast, typically used for a WBG device is an external gate resistance as low as 10Ω irrespective of whether turned on or off.

On the other hand, a WBG device has a smaller chip area than a Si device, and tends to have a higher internal gate resistance (including, e.g., the conductor resistance component across gate fingers). For example, while a Si device has an internal gate resistance of about 1Ω, a WBG device with a comparable on-resistance has an internal gate resistance of about 10Ω. In other words, a WBG device has an internal gate resistance about 10 times that of a Si device with a comparable on-resistance.

Thus, in a WBG device, the external gate resistance and the internal gate resistance have close values. Accordingly, when creating a device model of a WBG device, to achieve high accuracy, it is necessary to know the value of its internal gate resistance accurately.

The internal gate resistance is typically measured by measuring the impedance at a predetermined measurement frequency (e.g., 1 MHz) and deriving the internal gate resistance using an equivalent circuit. Inconveniently, with this known method, the obtained result varies greatly depending on how the measurement frequency and the equivalent circuit are designed.

For one thing, the gate waveform during switching cannot be represented by a single frequency, and thus the measurement frequency cannot be determined uniquely. This makes it difficult to measure the internal gate resistance accurately. For another thing, as WBG devices become integrated to increasingly high degrees, stray capacitances appear between gate fingers. This makes it difficult to define the equivalent circuit correctly.

In view of the problems encountered by the present inventor, an object of the invention disclosed herein is to provide a high-accuracy method of measuring a device parameter.

Solution to Problem

According to one aspect of what is disclosed herein, a method of measuring a device parameter includes: a step of repeatedly measuring the gate-source voltage (or gate-emitter voltage) of a switching element in its switching transient state while switching the external gate resistance for the switching element among m resistance values (where m is an integer of three or more); and a step of, while representing the internal gate resistance and the plateau voltage of the switching element by Rgin and Vp respectively and using the m resistance values of the external gate resistance and corresponding m voltage values of the gate-source voltage (or gate-emitter voltage) as $Rg(k)$ and $Vgs(k)$ respectively (where $k=1, 2 \ldots m$), performing the fitting of the equation $Vgs(k)=Rg(k)/(Rg(k)+Rgin)\times Vp$, thereby to derive the internal gate resistance Rgin or the plateau voltage Vp of the switching element. (A first configuration.)

According to another aspect of what is disclosed herein, a method of measuring a device parameter includes: a step of repeatedly measuring the gate-source voltage (or gate-emitter voltage) of a switching element in its switching transient state while switching the external gate resistance for the switching element among m resistance values (where m is an integer of three or more); a step of, while representing the internal gate resistance and the plateau voltage of the switching element by Rgin and Vp respectively and using the m resistance values of the external gate resistance and corresponding m voltage values of the gate-source voltage (or gate-emitter voltage) as $Rg(k)$ and $Vgs(k)$ respectively (where $k=1, 2 \ldots m$), performing the fitting of the equation $1/Vgs(k)=(Rgin/Vp)\times(1/Rg(k))+(1/Vp)$, thereby to express $1/Vgs(k)$ as a linear function of $1/Rg(k)$; a step of deriving the plateau voltage from the intercept of the linear function; and a step of deriving the internal gate resistance from the gradient of the linear function and the derived plateau voltage. (A second configuration.)

According to another aspect of what is disclosed herein, a method of measuring a device parameter includes: a step of setting the external gate resistance for a switching element at a first set value and measuring the gate-source voltage (or gate-emitter voltage) of the switching element in its switching transient state, thereby to acquire a first measured value; a step of setting the external gate resistance for the switching element at a second set value different from the first set value and measuring the gate-source voltage (or gate-emitter voltage) of the switching element in the switching transient state thereof, thereby to acquire a second measured value; a step of, while representing the internal gate resistance and the plateau voltage of the switching element by Rgin and Vp respectively, the first and second set values of the external gate resistance by Rg1 and Rg2 respectively, and the first and second measured values of the gate-source voltage (or gate-emitter voltage) by Vgs1 and Vgs2 respectively, solving the equation $Rgin=(Vgs1-Vgs2)\times Rg1\times Rg2/(Rg1\times Vgs2-Rg2\times Vgs1)$ or the equation $Vp=(Rg1-Rg2)\times Vgs1\times Vgs2/(Rg1\times Vgs2-Rg2\times Vgs1)$, thereby to derive the internal gate resistance or the plateau voltage. (A third configuration.)

According to another aspect of what is disclosed herein, a method of measuring a device parameter includes: a step of deriving the plateau voltage of a switching element; a step of setting the external gate resistance for the switching element; a step of measuring the gate-source voltage (or gate-emitter voltage) of the switching element in its switching transient state; and a step of, while representing the internal gate resistance, the external gate resistance, the gate-source voltage (or gate-emitter voltage), and the plateau voltage by Rgin, Rg, Vgs, and Vp respectively, solving the equation Rgin=Rg×(Vp−Vgs)/Vgs, thereby to derive the internal gate resistance. (A fourth configuration.)

In the measurement method according to any one of the first to fourth configurations described above, the switching transient state may be a state in which the drain-source voltage is in the middle of changing while the switching element is turning off (A fifth configuration.)

In the measurement method according to any one of the first to fifth configurations described above, the measurement target of the method may be a switching element having a gate terminal, a drain terminal (or collector terminal), a first source terminal (or first emitter terminal), and a second source terminal (or second emitter terminal). (A sixth configuration.)

In the measurement method according to any one of the first to fifth configurations described above, the measurement target of the method may be a switching element having a gate terminal, a drain terminal (or collector terminal), and a source terminal (or emitter terminal). (A seventh configuration.)

The measurement method according to the seventh configuration described above may further include: a step of measuring the drain current (or collector current) of the switching element and canceling based on the result of the measurement the influence of the inductance component that accompanies the source terminal (or emitter terminal). (An eighth configuration.)

In the measurement method according to any one of the first to eighth configurations described above, the measurement target of the method may be a switching element based on a wide-band-gap semiconductor. (A ninth configuration.)

According to another aspect of what is disclosed herein, a measurement device is configured to measure a device parameter of a switching element by the measurement method according to any one of the first to ninth configurations described above. (A tenth configuration.)

According to another aspect of what is disclosed herein, a method of creating a device model of a switching element is configured to use a device parameter of the switching element measured by the measurement method according to any one of the first to ninth configurations described above. (An eleventh configuration.)

Advantageous Effects of Invention

According to the invention disclosed herein, it is possible to provide a high-accuracy method of measuring a device parameter.

DESCRIPTION OF EMBODIMENTS

Measurement Device

Figure 1:
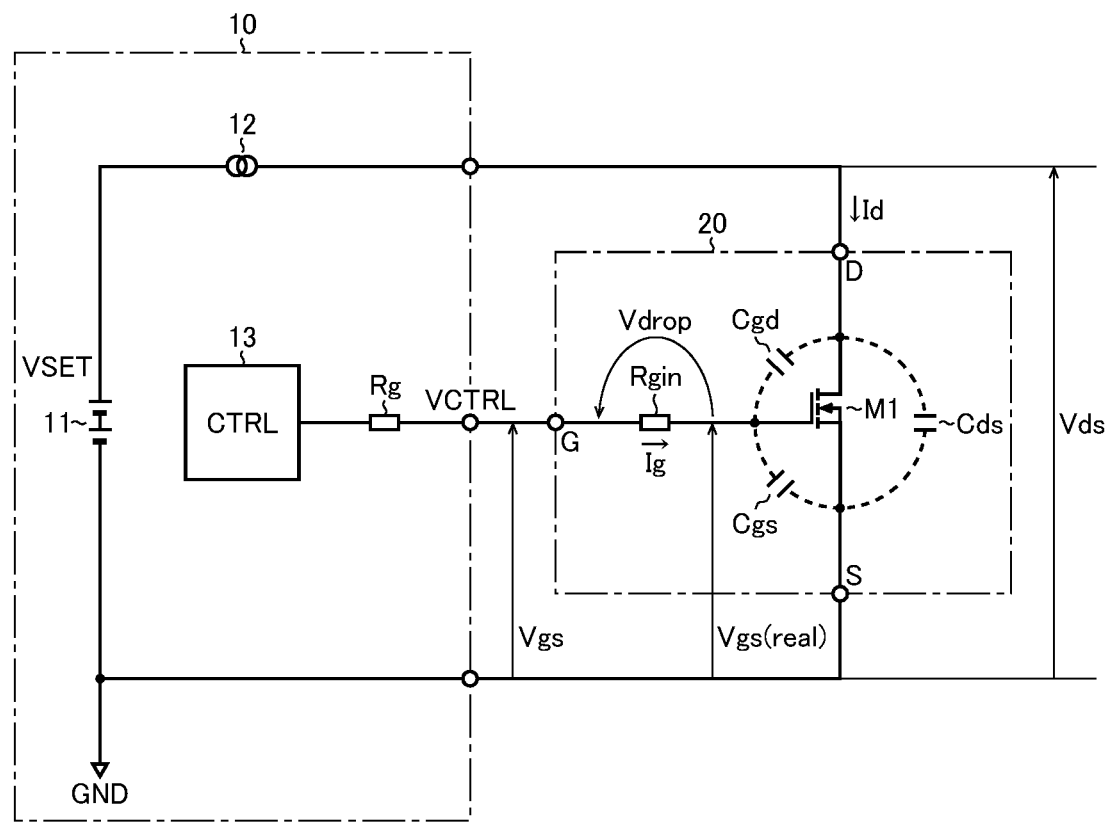
FIG. 1 is a diagram showing one configuration example of a measurement device.

FIG. 1 is an equivalent circuit diagram showing one configuration example of a measurement device. The measurement device 10 of this configuration example is a device for measuring a device parameter (such as an internal gate resistance Rgin and/or a plateau voltage Vp) of a switching element 20, and includes a voltage source 11, a current source 12, and a controller 13. The measurement device 10 also has an external gate resistance Rg which is externally connected to the gate of the switching element 20.

The switching element 20 is a semiconductor switching device as a measurement target (DUT [device under test]) of the measurement device 10, and in FIG. 1 is exemplified by an N-channel MOS field-effect transistor M1. Examples of switching elements 20 of which a device parameter it is particularly preferable to measure using the measurement device 10 proposed herein include WBG devices (such as SiC power transistors and GaN power transistors) of which the external gate resistance Rg and the internal gate resistance Rgin have close values.

As shown in equivalent terms in FIG. 1, the transistor M1 has, between its gate and source, a gate-source parasitic capacitance Cgs; between its gate and drain, a gate-drain parasitic capacitance Cgd; and between its drain and source, a drain-source parasitic capacitance Cds. The input capacitance Ciss of the transistor M1 can be given as the sum (=Cgs+Cgd) of the gate-source parasitic capacitance Cgs and the gate-drain parasitic capacitance Cgd. Likewise, the output capacitance Coss of the transistor M1 can be given as the sum (=Cds+Cgd) of the drain-source parasitic capacitance Cds and the gate-drain parasitic capacitance Cgd.

The transistor M1 further has, at its gate, an internal gate resistance Rgin (including the conductor resistance component of gate fingers). While in reality the transistor M1 is also accompanied by parasitic diodes and parasitic inductances, for the sake of convenient illustration they are omitted from illustration and description.

As for the relevant voltages and currents associated with the switching element 20, Vgs represents the gate-source voltage, Vgs(real) represents the voltage applied to the gate oxide film (i.e., real gate-source voltage), Vds represents the drain-source voltage, Id represents the drain current, and Ig represents the gate current.

When the gate current Ig is present, across the internal gate resistance Rgin, a voltage drop Vdrop (=−Ig×Rgin) occurs, and thus Vgs≠Vgs(real). On the other hand, when no gate current Ig is present, the just-mentioned voltage drop Vdrop equals zero, and thus, if parasitic capacitances are ignored, Vgs=Vgs(real).

The voltage source 11 serves as a means for setting the drain-source voltage Vds applied to the transistor M1. Specifically, their interconnection is as follows. The positive terminal of the voltage source 11 (i.e., an application terminal for a setting voltage VSET) is connected to the first terminal of current source 12. The second terminal of the current source 12 is connected to the drain terminal D of the transistor M1. The source terminal S of the transistor M1 is connected to the negative terminal of the voltage source 11 (i.e., a ground terminal GND). Thus the voltage source 11 and the current source 12 are connected in series with respect to the switching element 20. That is, in the measurement system shown in FIG. 1, the voltage source 11, the current source 12, and the switching element 20 (i.e., the transistor M1) form a closed circuit.

The current source 12 serves as a means for setting the current value of the drain current Id that passes during the on-period of the transistor M1. As the current source 12, an inductive load such as a coil can be used. In that case, a flywheel diode is preferably connected in parallel with the current source 12.

The controller 13 feeds a pulsating control voltage VCTRL via the external gate resistance Rg to the gate terminal G of the transistor M1, and thereby turns on and off the transistor M1.

The measurement device 10 further includes, though not illustrated, voltmeters and ammeters for measuring the gate-source voltage Vgs, the drain-source voltage Vds, the drain current Id, and the gate current Ig of the transistor M1. With those the measurement device 10 observes the switching transient state of the transistor M1 during at least one of its turn-on and turn-off transitions, and thereby measures a device parameter (such as the internal gate resistance Rgin and/or the plateau voltage Vp).

Here, the switching transient state of the transistor M1 can be understood to be a state in which at least one of the drain-source voltage Vds and the drain current Id is in the middle of changing, or a state in which the gate current Ig is passing.

A detailed description will now be given of a method of measuring a device parameter (a method of deriving a device parameter such as the internal gate resistance Rgin or the plateau voltage Vp from actual switching behavior) using the measurement device 10.

Switching Transient Response

Figure 2:
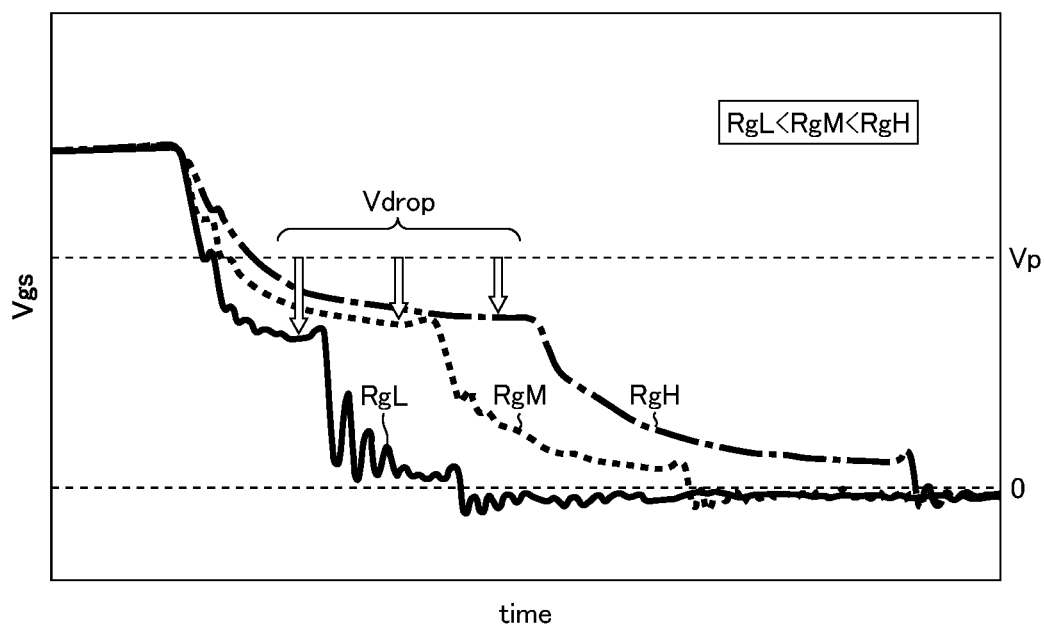
FIG. 2 is a diagram showing the turn-off transient response of a gate-source voltage.

FIG. 2 is a switching waveform diagram showing the turn-off transient response of the gate-source voltage Vgs (solid line: with Rg=RgL, broken line: with Rg=RgM, and dash-dot-line: with Rg=RgH, where RgL<RgM<RgH).

As the transistor M1 turns off, when the drain current Id completes changing and the drain-source voltage Vds (not illustrated) is in the middle of turning from low level (≈0 V) to high level (≈VSET), there occurs, as shown in FIG. 2, a region in which the gate-source voltage Vgs remains constant (or almost constant), i.e., what is called a plateau region (i.e., a period in which the real gate-source voltage Vgs(real) remains equal to the plateau voltage Vp). That is, in the plateau region, while the gate-source voltage Vgs and the gate current Ig remain constant, the drain-source voltage Vds alone keeps changing.

As described above, in the plateau region, basically the gate current Ig and the drain current Id are both constant. Accordingly, the inductance components that accompany the gate and source, respectively, of the transistor M1 can be ignored.

What the measurement device 10 can measure as the gate-source voltage Vgs is not just the real gate-source voltage Vgs(real) applied to the gate oxide film of the transistor M1 but has a voltage value (Vgs=Vgs(real)+Vdrop) which additionally includes the voltage drop Vdrop (=Ig×Rgin) occurring across the internal gate resistance Rgin.

Since the plateau voltage Vp and the internal gate resistance Rgin of the transistor M1 both remain at fixed values, the gate current Ig in the plateau region (i.e., −Vp/(Rg+Rgin)) is determined uniquely in accordance with the external gate resistance Rg (hence the switching speed of the transistor M1). On the other hand, the voltage drop Vdrop that occurs across the internal gate resistance Rgin depends on the gate current Ig in the plateau region. Accordingly, the gate-source voltage Vgs (=Vp+Vdrop) in the plateau region changes in accordance with the external gate resistance Rg.

Specifically, the lower the external gate resistance Rg (i.e., the higher the switching speed of the transistor M1), the higher the gate current Ig and thus the greater the absolute value of the voltage drop Vdrop, resulting in a lower gate-source voltage Vgs in the plateau region. Put reversely, the higher the external gate resistance Rg (i.e., the lower the switching speed of the transistor M1), the lower the gate current Ig and thus the smaller the voltage drop Vdrop, resulting in a higher gate-source voltage Vgs in the plateau region.

With the external gate resistance Rg (hence the gate current Ig) constant, the absolute value of the voltage drop Vdrop (=Ig×Rgin) is determined in accordance with the internal gate resistance Rgin of the transistor M1. Accordingly, by measuring the gate-source voltage Vgs (hence the voltage drop Vdrop) in the plateau region, it is possible to derive the internal gate resistance Rgin.

While discussed above is an example where the gate-source voltage Vgs is measured when the transistor M1 turns off, it is also possible to measure the gate-source voltage Vgs when, for example, the transistor M1 turns on. It should however be noted that, when the transistor M1 turns on, as compared with when it turns off, the noise on the gate-source voltage Vgs in the switching transient state (plateau region) tends to be large, and this may be disadvantageous in terms of measurement accuracy.

In the following description, novel methods of deriving a device parameter (such as a internal gate resistance Rgin or a plateau voltage Vp) will be described in detail by way of various practical examples.

Method of Deriving a Device Parameter (First Example of Derivation

Figure 3:
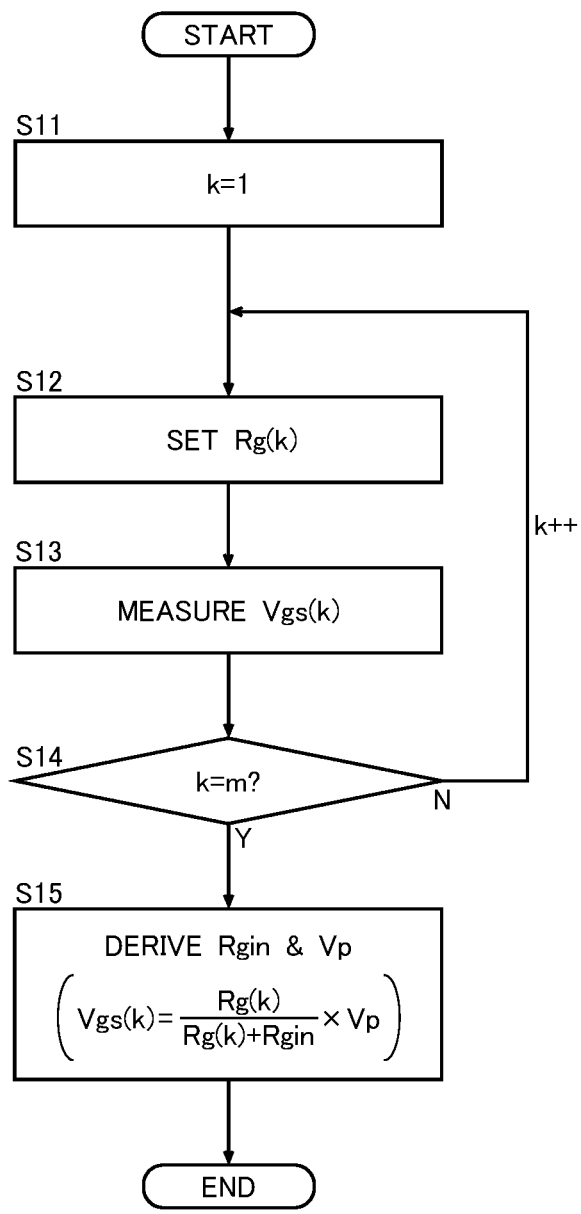
FIG. 3 is a diagram showing a first example of deriving a device parameter.

FIG. 3 is a flow chart showing a first example of deriving a device parameter. First, at step S11, a variable k, which represents the number of times that measurement has been done, is initialized (such that, e.g., k=1).

Next, at step S12, the external gate resistance Rg is set at a set value Rg(k).

Subsequently, at step S13, the gate-source voltage Vgs of the transistor M1 in its switching transient state (e.g., in the plateau region during the turn-off transition) to acquire a measured value Vgs(k). For higher measurement accuracy of the internal gate resistance Rgin, it is preferable, for example, to measure the gate-source voltage Vgs in the plateau region a plurality of times and to calculate the average value as the definitive measured value.

Next, at step S14, whether the variable k equals a predetermined value m (where m is an integer of three or more) is checked. If step S14 results in "yes", the flow of operation proceeds to step S15. By contrast, if step S14 results in "no", the variable k is incremented by one, and the flow of operation returns to step S12.

Thus steps S11 to S14 are steps through which, while the external gate resistance Rg of the transistor M1 is switched among m set values Rg(1) to Rg(m) (where Rg(1)≠Rg(2) ≠Rg(m)), the measurement of the gate-source voltage Vgs in the switching transient state is repeated to acquire m measured values Vgs(1) to Vgs(m) sequentially.

If step S14 results in "yes", then at step S15, using m sets of external gate resistances Rg(1) to Rg(m) and gate-source voltages Vgs Vgs(1) to Vgs(m), fitting is performed with Equation X: Vgs(k)=Rg(k)/(Rg(k)+Rgin)×Vp to derive the internal gate resistance Rgin and the plateau voltage Vp.

Here Equation X results from substituting Ig=Vp/(Rg+Rgin) in the relational equation Vdrop=Vgs−Vp=−Ig×Rgin.

Figure 4:
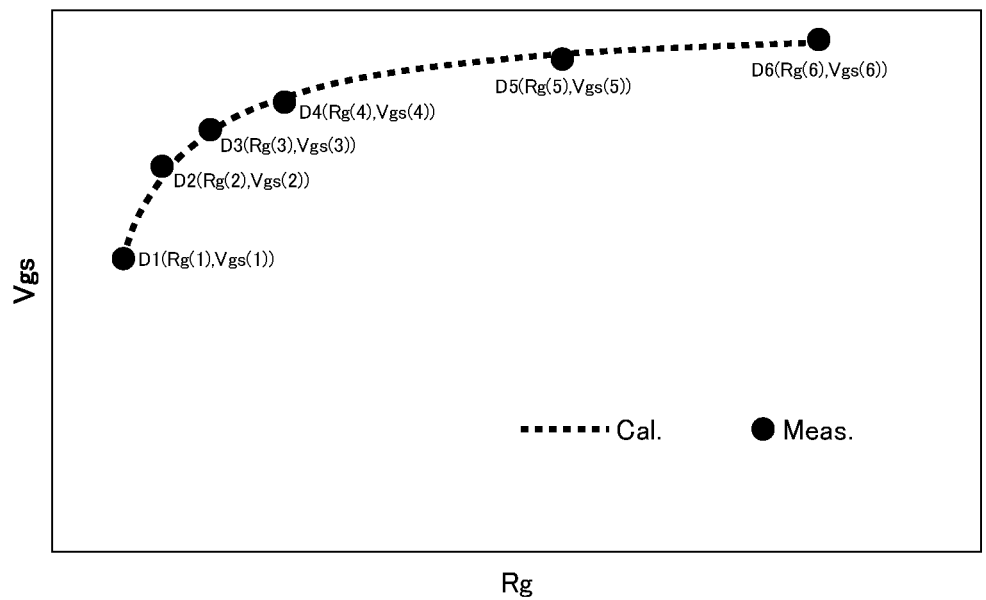
FIG. 4 is a diagram showing one example of fitting.

FIG. 4 is a diagram (Rg-Vgs correlation diagram) showing an example of the fitting at step S15. The black dots in the diagram indicate m pieces of measured data D1 to Dm (in the diagram a total of six pieces of data D1(Rg(1),Vgs(1)), D2(Rg(2),Vgs(2)), D3(Rg(3),Vgs(3)), D4(Rg(4),Vgs(4)), D5(Rg(5),Vgs(5)), and D6(Rg(6),Vgs(6))). The broken line in the diagram indicates the curve of Equation X having undergone the fitting.

In the fitting at step S15, for example, the optimal solutions of the internal gate resistance Rgin and the plateau voltage Vp, respectively, to be included in Equation X can be calculated such as to minimize the deviations of the m pieces of measured data D1 to Dm from Equation X.

As described above, with this method, the internal gate resistance Rgin and the plateau voltage Vp are derived through the fitting of Equation X, and thus the internal gate resistance Rgin and the plateau voltage Vp are derived based on at least three pieces of measured data. It is thus possible to accurately derive the internal gate resistance Rgin and the plateau voltage Vp.

Method of Deriving a Device Parameter (Second Example of Derivation

Figure 5:
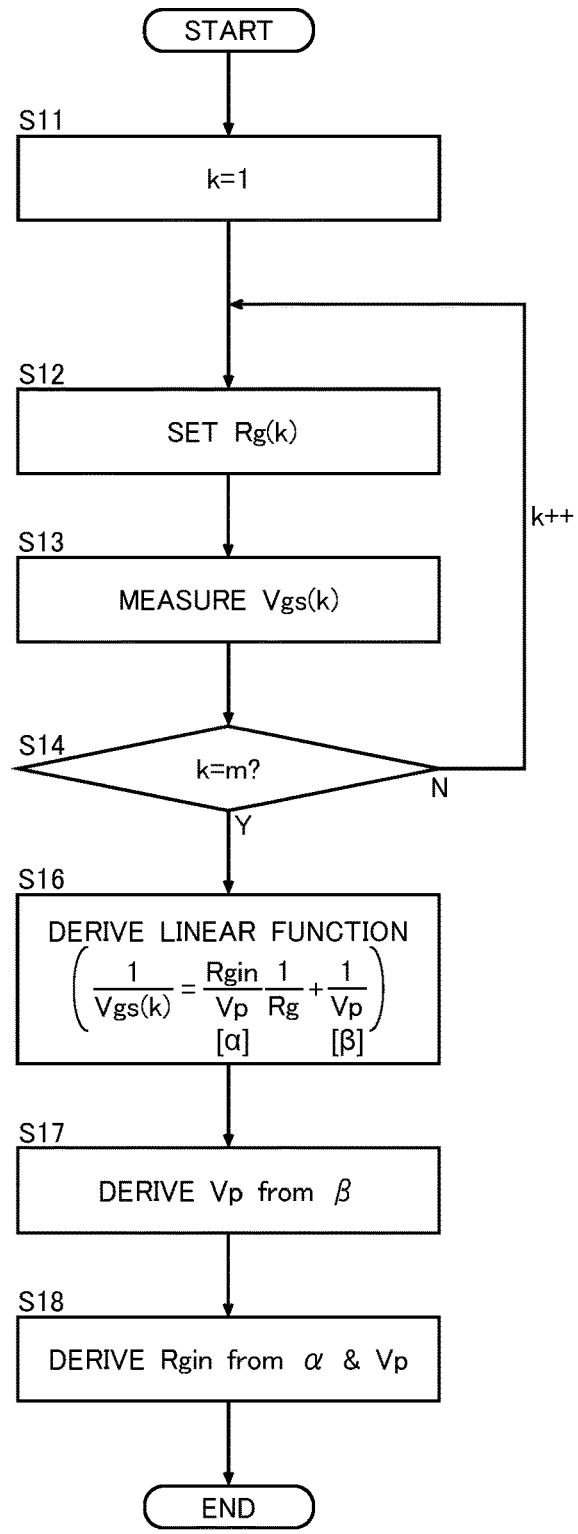
FIG. 5 is a diagram showing a second example of deriving a device parameter.

FIG. 5 is a flow chart showing a second example of deriving a device parameter. Through steps S11 to S14 in this example of derivation, as in the first example of derivation (FIG. 3), while the external gate resistance Rg of the transistor M1 is switched among m set values Rg(1) to Rg(m) (where Rg(1)≠Rg(2)≠Rg(m)), the measurement of the gate-source voltage Vgs in the switching transient state is repeated to acquire m measured values Vgs(1) to Vgs(m) sequentially.

If Step S14 results in "yes", then at step S16, using m sets of external gate resistances Rg(1) to Rg(m) and gate-source voltages Vgs Vgs(1) to Vgs(m), fitting is performed with Equation X: 1/Vgs(k)=(Rgin/Vp)×(1/Rg(k))+(1/Vp) so as to express 1/Vgs(k) as a linear function (1/Vgs(k)=α×(1/Rg(k))+β) of 1/Rg(k) (where the gradient α=Rgin/Vp and the intercept β=1/Vp).

Here Equation X' results from rearranging Equation X given previously.

Subsequently, at step S17, from the intercept β(=1/Vp) of the above linear function, the plateau voltage Vp is derived.

Then, at step S18, from the gradient α(=Rgin/Vp) of the above linear function and the plateau voltage Vp derived at step S17, the internal gate resistance Rgin is derived.

Figure 6:
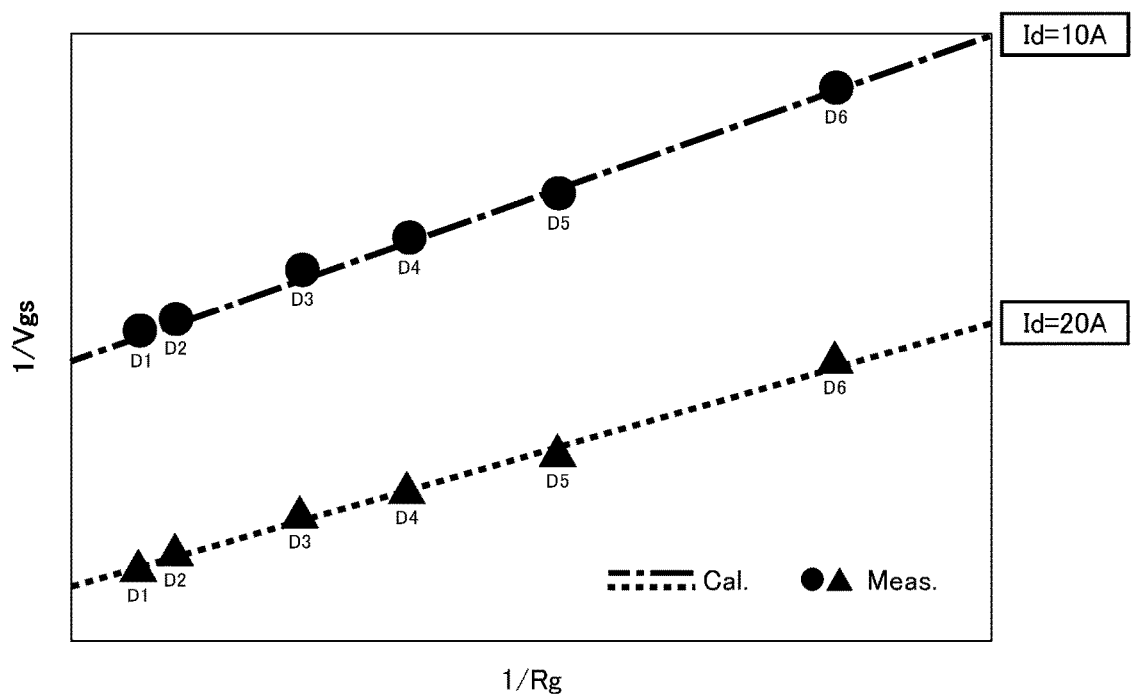
FIG. 6 is a diagram showing a relationship between 1/Rg and 1/Vgs.

FIG. 6 is a diagram (1/Rg-1/Vgs correlation diagram) showing a relationship between 1/Rg and 1/Vgs. The circular and triangular marks there indicate, for cases where Id=10 A and 20 A respectively, m pieces of measured data D1 to Dm (where, e.g., m=6). The dash-and-dot line and the broken line indicate, for those same cases respectively, the lines of Equation X' (linear function) having undergone the fitting.

In the fitting at step S16, for example, the optimal solutions of the gradient α and intercept β, respectively, of the linear function can be calculated such as to minimize the deviations of the m pieces of measured data D1 to Dm from Equation X'.

As described above, with this method, through the fitting of Equation X', 1/Vgs(k) is expressed as a linear function (1/Vgs(k)=α×(1/Rg(k))+β) of 1/Rg, and the internal gate resistance Rgin and the plateau voltage Vp are derived from its gradient α and intercept β. Thus, as with the first example of derivation described previously, the internal gate resistance Rgin and the plateau voltage Vp are derived based on at least three pieces of measured data. It is thus possible to accurately derive the internal gate resistance Rgin and the plateau voltage Vp.

Method of Deriving a Device Parameter (Third Example of Derivation

Figure 7:
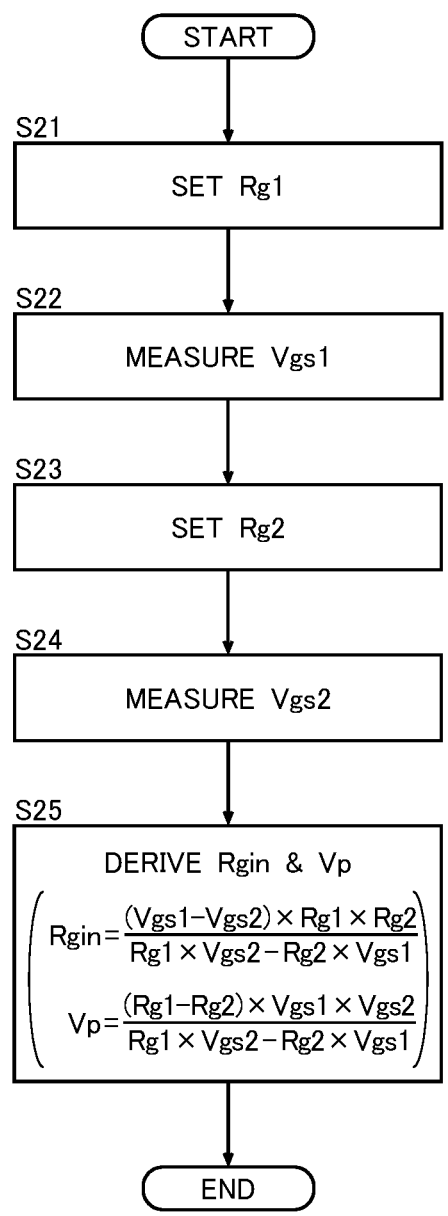
FIG. 7 is a diagram showing a third example of deriving a device parameter.

FIG. 7 is a flow chart showing a third example of deriving a device parameter. First, at step S21, the external gate resistance Rg is set at a first set value Rg1.

Subsequently, at step S22, the gate-source voltage Vgs of the transistor M1 in its switching transient state (e.g., in the plateau region during the turn-off transition) is measured to acquire a first measured value Vgs1.

Next, at step S23, the external gate resistance Rg is set at a second set value Rg2≠Rg1).

Subsequently, at step S24, as at step S22 described above, the gate-source voltage Vgs of the transistor M1 in its switching transient state (e.g., in the plateau region during the turn-off transition) is measured to acquire a second measured value Vgs2.

Finally, at step S25, Equation Y1: Rgin=(Vgs1−Vgs2)× Rg1×Rg2/(Rg1×Vgs2−Rg2×Vgs1) is solved to derive the internal gate resistance Rgin.

Here Equation Y1 results from substituting (Rg1, Vgs1) and (Rg2, Vgs2) each in Equation X given previously so as to cancel the term of the plateau voltage Vp.

The other way around, canceling the term of the internal gate resistance Rgin in Equation X given previously gives Equation Y2: Vp=(Rg1−Rg2)×Vgs1×Vgs2/(Rg1×Vgs2− Rg2×Vgs1), and thus the plateau voltage Vp can be derived.

As shown in FIG. 2 referred to previously, the higher the external gate resistance Rg, the longer the period for which the gate-source voltage Vgs is kept constant in the switching transient state. Accordingly, for easy measurement of the gate-source voltage Vgs, it is preferable that the first and second set values Rg1 and Rg2 be as great as possible. However, increasing both the first and second set values Rg1 and Rg2 results in a small difference between them, leading to increased influence of measurement variations. Thus, in the third example of derivation, it is essential to set the external gate resistance Rg at appropriate set values.

Method of Deriving a Device Parameter (Fourth Example of Derivation

Figure 8:
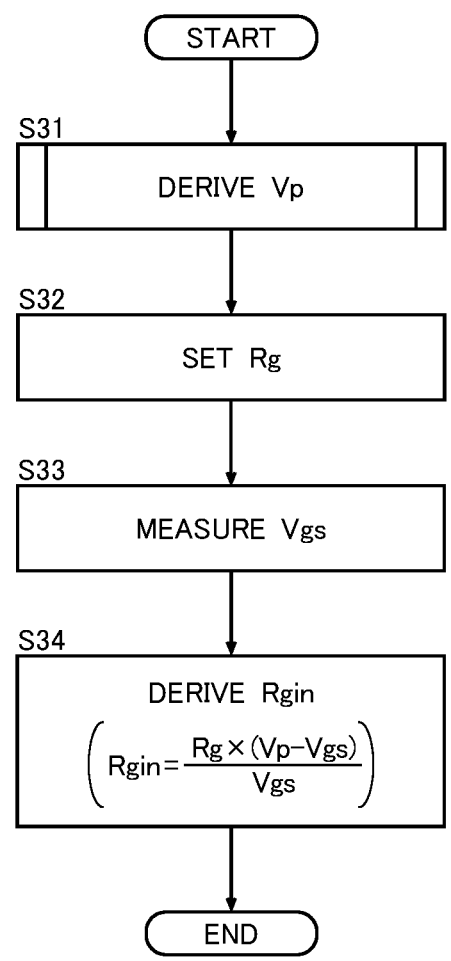
FIG. 8 is a diagram showing a fourth example of deriving a device parameter.

FIG. 8 is a flow chart showing a fourth example of deriving a device parameter. First, at step S31, the plateau voltage Vp of the transistor M1 is derived.

The plateau voltage Vp can be derived by any known method, and therefore in this respect no detailed description will be given. For example, the plateau voltage Vp can be derived from the ratio of the gate-source voltages Vgs,on and Vgs,off measured during the turn-on and turn-off transitions, respectively, of the transistor M1 to the gate currents Ig,on and Ig,off measured during the turn-on and turn-off transitions, respectively, of the transistor M1, according to the equation Vp=[(Vgs,off×Ig,on)−(Vgs,on×Ig,off)]/(Ig,on−Ig,off).

Figure 9:
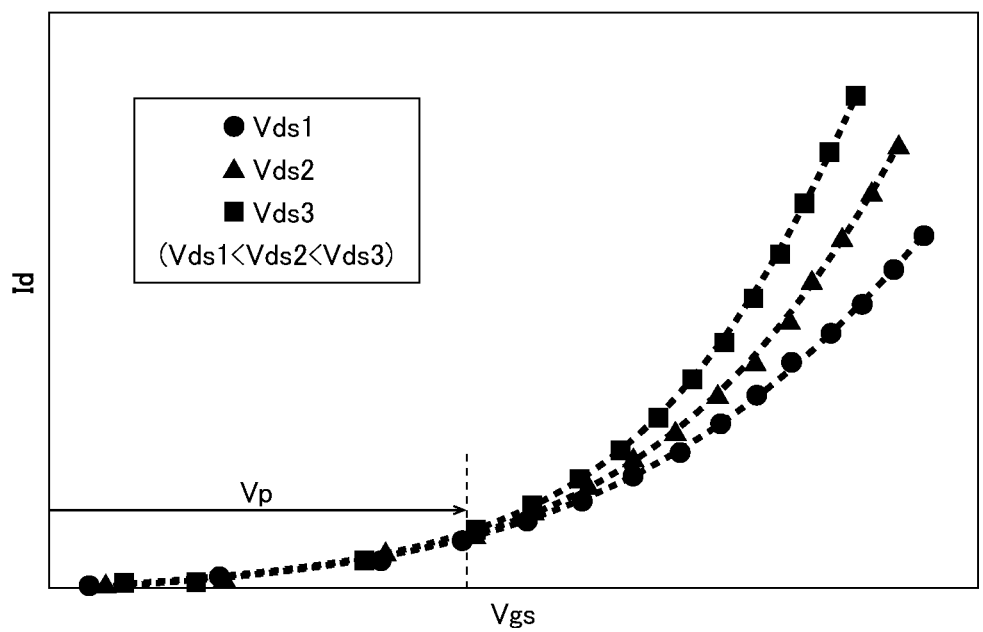
FIG. 9 is a diagram showing a relationship between a current-voltage response and a plateau voltage.

FIG. 9 is a diagram showing the relationship between the Id-Vgs response of the transistor M1 (circular marks: with Vds=Vds1, triangular marks: with Vds=Vds2, square marks with Vds=Vds3, where Vds1<Vds2<Vds3) and the plateau voltage Vp. The Id-Vgs response of the transistor M1 is identical irrespective of the drain-source voltage Vds so long as Vgs<Vp.

Referring back to FIG. 8, the description of the flow of operation will be continued. At step S32, the external gate resistance Rg is set, and at step S33, the gate-source voltage Vgs of the transistor M1 in its switching transient state (e.g., in the plateau region during the turn-off transition) is measured.

Finally, at step S34, Equation Z Rgin=Rg×(Vp−Vgs)/Vgs is solved to derive the internal gate resistance Rgin. Here Equation Z results from rearranging Equation X given previously.

Current Variation in a Voltage Change Region

Figure 10:
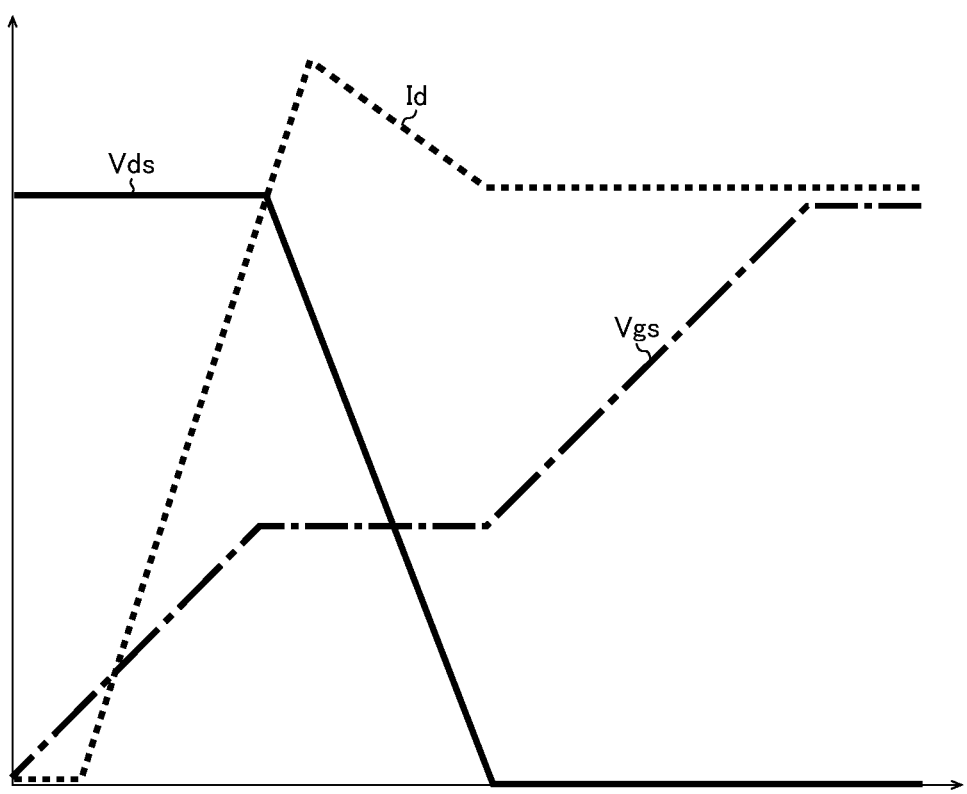
FIG. 10 is a diagram showing current variation occurring in a voltage change region.

FIG. 10 is a diagram showing how the drain current Id varies in a region where the drain-source voltage Vds changes (here the turn-on transient response). In the diagram, a solid line represents the drain-source voltage Vds, a broken line represents the drain current Id, and a dash-and-dot line represents the gate-source voltage Vgs.

Intrinsically, in the switching transient state of the transistor M1, it is after the drain current Id completes changing that the drain-source voltage Vds starts to change. That is, when the gate-source voltage Vgs is measured in a region where the drain-source voltage Vds changes, the drain current Id is supposed to be constant.

In reality, however, in a region where the drain-source voltage Vds changes, a charge-discharge current of the output capacitance Coss passes, and this cases the drain current Id to vary.

While FIG. 10 shows the turn-on transient response of the transistor M1, also when the transistor M1 turns off, the drain current Id can vary in a region where the drain-source voltage Vds changes.

Such variation of the drain current Id adversely affects the measurement of the gate-source voltage Vgs, and can lead to a degradation in the derivation accuracy of a device parameter (such as the internal gate resistance Rgin and/or the plateau voltage Vp). This problem will now be studied.

Switching Element (Four-Pin Device

Figure 11:
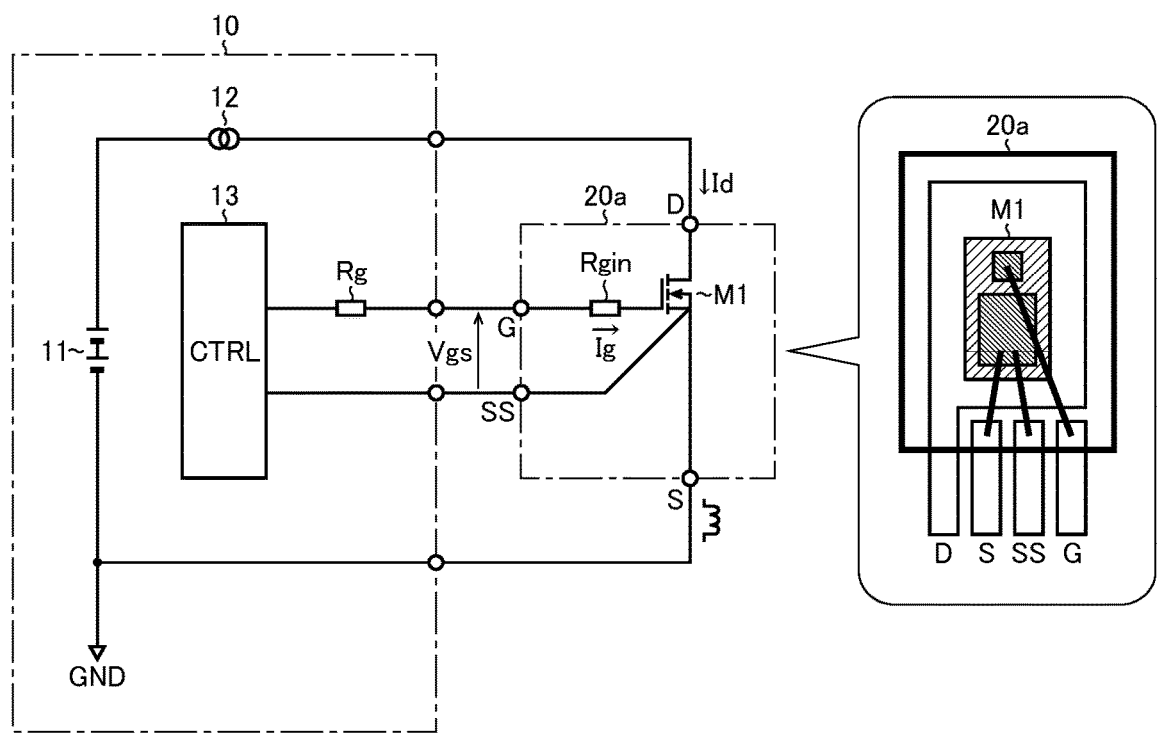
FIG. 11 is a diagram showing an example of connection of a four-pin device.

FIG. 11 is a diagram showing an example of connection of a four-pin device. There, as the measurement target of the measurement device 10, a switching element 20a with a four-pin package (see inside the balloon in the diagram) is connected. Specifically the switching element 20a has, in addition to a gate terminal G, a drain terminal D, and a source terminal S as one commonly has, a second source terminal SS for gate driving (i.e., a source sense terminal that is connected only to the controller 13 without being connected to the negative terminal of the voltage source 11).

With such a four-pin device as the measurement target, the inductance component that accompanies the source terminal S does not affect the measurement. Accordingly, even if, for the sake of discussion, the drain current Id varies in a region where the drain-source voltage Vds changes, by the derivation method described previously it is possible to accurately derive a device parameter of the transistor M1.

Switching Element (Three-Pin Device

Figure 12:
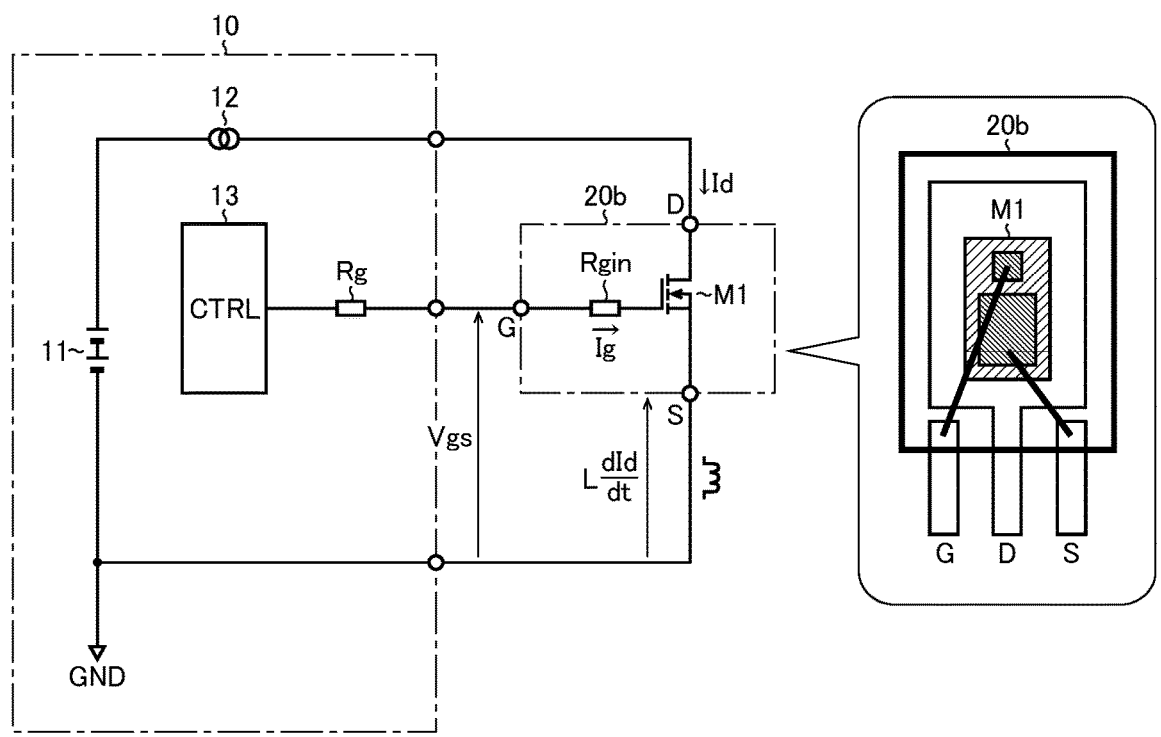
FIG. 12 is a diagram showing an example of connection of a three-pin device.

FIG. 12 is a diagram showing an example of connection of a three-pin device. There, as the measurement target of the measurement device 10, a switching element 20b with a common three-pin package (see inside the balloon in the diagram) is connected. Specifically the switching element 20b has a gate terminal G, a drain terminal D, and a source terminal S as one commonly has, and does not have a second source terminal SS like the one mentioned previously (FIG. 11).

With such a three-pin device as the measurement target, the inductance component that accompanies the source terminal S affects the measurement. Specifically, as the drain current Id varies in a region where the drain-source voltage Vds changes, an induced voltage (L×dId/dt) appears in the inductance component L that accompanies the source terminal S. This affects the result of measurement of the gate-source voltage Vgs, and makes it impossible to derive a device parameter of the transistor M1 accurately.

Accordingly, with a three-pin device as the measurement target, it is preferable to add steps of measuring the drain current Id of the transistor M1 and, based on the result of the measurement, canceling the influence of the inductance component L that accompanies the source terminal S. Specifically, the amount to be cancelled can be calculated from the amount of change of the drain current Id and the inductance component L accompanying the source terminal S.

One way to avoid the problem mentioned above is to perform measurement with the external gate resistance Rg set at a high value so as to minimize the charge-discharge current of the parasitic capacitance. In that case, however, in response to a change in the external gate resistance Rg, the gate current Ig exhibits a sluggish change, and this has to be taken into account as leading to lower then expected measurement accuracy.

Method of Creating a Device Model

In creating a device model of the transistor M1, the internal gate resistance Rgin and/or the plateau voltage Vp measured by the measurement method described above can be parameterized and included in the description of an equivalent circuit of the device model. In that way it is possible to faithfully reproduce the behavior of the transistor M1 in a simulation and hence to enhance the accuracy of the simulation.

Application to IGBTs

While the embodiment described above deals with examples where the measurement target is a MOSFET, this is not meant to limit the measurement target to devices of any specific type; the measurement target may be, for example, an IGBT (insulated-gate bipolar transistor).

In that case, with respect to the names of the terminals, voltages, and currents associated with the transistor M1 in the above description, "sources" can be read as "emitter" and "drain" can be read as "collector".

It should however be noted that, compared with MOSFETs, IGBTs have larger chip areas and lower internal gate resistances Rgin, and this makes measurement more difficult. IGBTs also require higher charge-discharge currents for the output capacitance Coss, and this is expected to make measurement with 3-pin devices difficult.

Other Modifications

The various technical features disclosed herein may be implemented in any other manner than as in the embodiments described above, and allow for many modifications without departing from the spirit of the present invention. That is, the embodiments descried above should be understood to be in every aspect illustrative and not restrictive. The technical scope of the present invention is defined not by the description of the embodiments given above but by the appended claims, and should be understood to encompass any modifications made in a sense and scope equivalent to the claims.

INDUSTRIAL APPLICABILITY

A method of measuring a device parameter according to what is disclosed herein can be employed in creating a device model of a switching device based on a wide-band-gap semiconductor (such as a SiC power transistor and a GaN power transistor).

REFERENCE SIGNS LIST 10 measurement device
11 voltage source
12 current source
13 controller
20, 20a, 20b switching element
Cds drain-source parasitic capacitance
Cgs gate-source parasitic capacitance
Cgd gate-drain parasitic capacitance
D drain terminal
G gate terminal
M1 N-channel MOS field-effect transistor
Rg external gate resistance
Rgin internal gate resistance
S source terminal (first source terminal)
SS second source terminal (second source terminal)

The invention claimed is:

1. A method of measuring a device parameter, the method comprising:
repeatedly measuring a gate-source voltage (or gate-emitter voltage) of a switching element in a switching transient state thereof while switching an external gate resistance for the switching element among m resistance values (where m is an integer of three or more); and
while representing an internal gate resistance and a plateau voltage of the switching element by Rgin and Vp respectively and using the m resistance values of the external gate resistance and corresponding m voltage values of the gate-source voltage (or gate-emitter voltage) as Rg(k) and Vgs(k) respectively (where k=1, 2 . . . m), performing fitting of an equation Vgs(k)=Rg(k)/(Rg(k)+Rgin) x Vp, thereby to derive the internal gate resistance Rgin or the plateau voltage Vp of the switching element.

2. The method according to claim 1, wherein the switching transient state is a state in which a drain-source voltage is in a middle of changing while the switching element is turning off.

3. The method according to claim 1, wherein a measurement target of the method is the switching element having a gate terminal, a drain terminal (or collector terminal), a first source terminal (or first emitter terminal), and a second source terminal (or second emitter terminal).

4. The method according to claim 1, wherein a measurement target of the method is the switching element having a gate terminal, a drain terminal (or collector terminal), and a source terminal (or emitter terminal).

5. The method according to claim 4, further comprising: measuring a drain current (or collector current) of the switching element and canceling based on a result of the measurement an influence of an inductance component that accompanies the source terminal (or emitter terminal).

6. The method according to claim 1, wherein a measurement target of the method is the switching element based on a wide-band-gap semiconductor.

* * * * *